United States Patent
Stömmer

(10) Patent No.: US 7,098,573 B2
(45) Date of Patent: Aug. 29, 2006

(54) FREQUENCY-TUNABLE RESONATOR

(75) Inventor: Ralph Stömmer, Neubiberg (DE)

(73) Assignee: Epcos AG, Munich (DE)

( * ) Notice: Subject to any disclaimer, the term of this patent is extended or adjusted under 35 U.S.C. 154(b) by 187 days.

(21) Appl. No.: 10/482,885

(22) PCT Filed: May 21, 2002

(86) PCT No.: PCT/DE02/01836

§ 371 (c)(1),
(2), (4) Date: Jun. 7, 2004

(87) PCT Pub. No.: WO03/005576

PCT Pub. Date: Jan. 16, 2003

(65) Prior Publication Data

US 2004/0212277 A1  Oct. 28, 2004

(30) Foreign Application Priority Data

Jul. 3, 2001 (DE) .............................. 101 32 181

(51) Int. Cl.
*H01L 41/08* (2006.01)
*H03H 9/17* (2006.01)

(52) U.S. Cl. ...................... 310/320; 310/363; 310/364; 310/365; 310/334

(58) Field of Classification Search ................. 310/320, 310/363–365, 334
See application file for complete search history.

(56) References Cited

U.S. PATENT DOCUMENTS

| | | | |
|---|---|---|---|
| 4,719,383 A | 1/1988 | Wang et al. ................. 310/324 |
| 5,248,564 A * | 9/1993 | Ramesh ...................... 428/688 |
| 5,801,476 A | 9/1998 | Sturzebecher et al. ...... 310/324 |
| 6,410,162 B1 * | 6/2002 | White et al. ................ 428/642 |
| 6,987,029 B1 * | 1/2006 | Niki et al. ..................... 438/47 |
| 2002/0000034 A1 * | 1/2002 | Jenson ....................... 29/623.5 |

OTHER PUBLICATIONS

*Patent Abstracts of Japan* for Japanese Publication No. 58 095221 of Jun. 6, 1983.

* cited by examiner

*Primary Examiner*—Darren Schulburg
*Assistant Examiner*—J. Aguirrechea
(74) *Attorney, Agent, or Firm*—Schiff Hardin LLP

(57) ABSTRACT

A frequency-tunable resonator comprises a basic element having at least one piezoelectric layer and at least one semiconducting layer. The electrodes, formed on main surface situated opposite one another of the basic element, are loaded with an external voltage, whereby the resonant frequency of the basic element or of the resonator can be in dependence on the voltage.

22 Claims, 5 Drawing Sheets

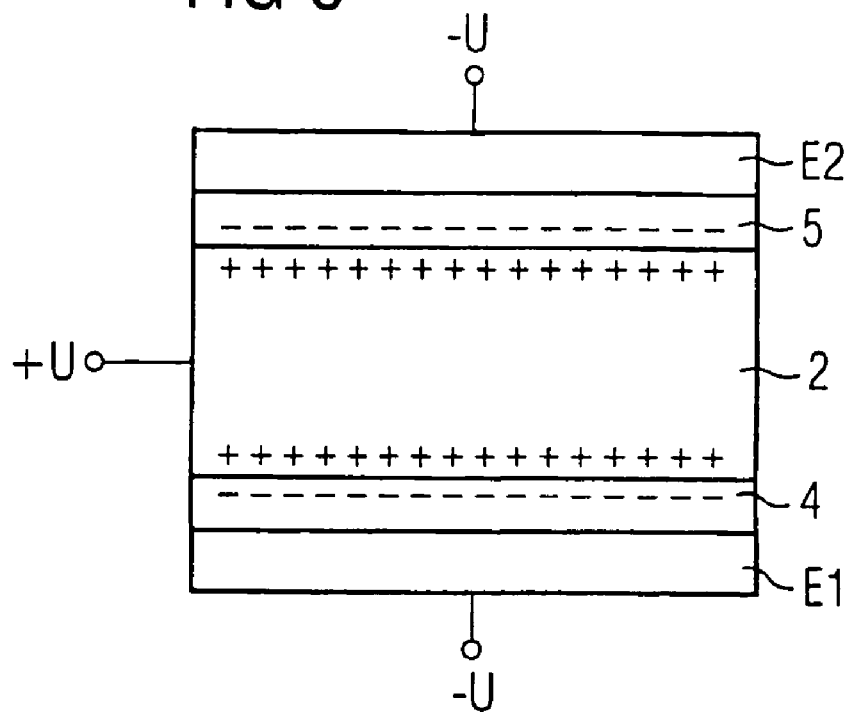
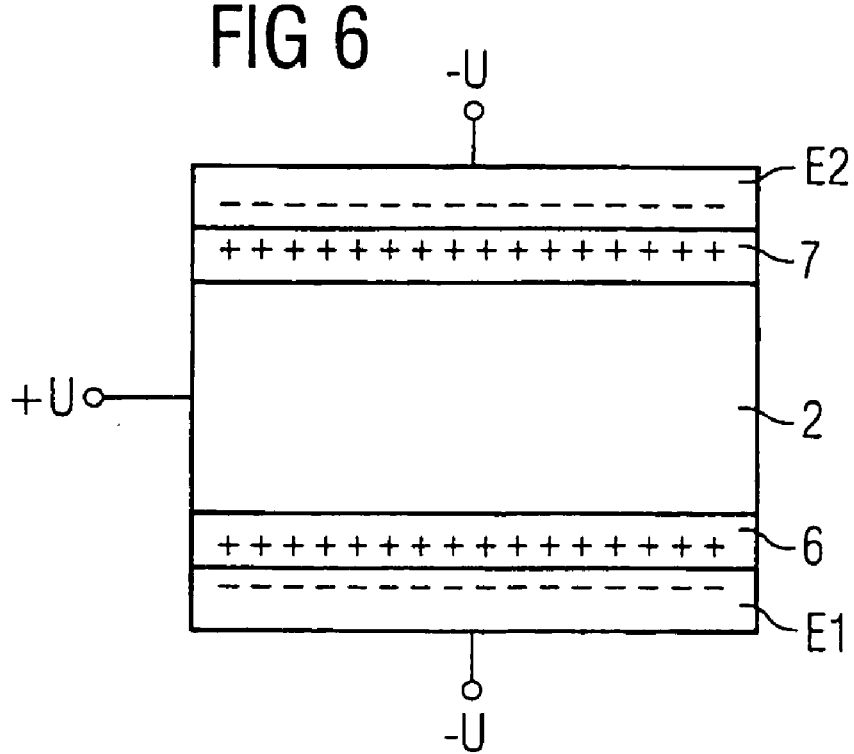

FREQUENCY-TUNABLE RESONATOR

BACKGROUND OF THE INVENTION

Volume resonators/oscillators that operate with acoustic waves, known as thin-film bulk acoustic resonators (FBAR), or also called bulk acoustic wave (BAW) resonators, are based on a piezoelectric basic element that is provided with an electrode on each of two main surfaces. Such a resonator has a resonant frequency fr that is dependent on the thickness $L_0$ of the basic element, measured between the electrodes, in accordance with the formula $$fr = v/2L_0.$$

Here, v designates the velocity of the longitudinal wave in the piezoelectric basic element. Such resonators can, for example, be used in the construction of RF filters. The layer thickness required for the basic element (in the µm range) in this frequency range means that thin-film methods are required for the manufacture of the basic element. In order to use the FBAR resonators for RF filters, and to achieve a high yield, a high degree of homogeneity of the layer thickness, with a maximum deviation of less than 0.3%, is required, in order both to obtain a sharp resonant frequency and to obtain the position of the resonant frequency at the desired location. However, using currently available layer deposition technologies, this layer thickness homogeneity cannot be achieved on substrates having diameters greater than 150 mm.

There do exist methods for treating a layer manufactured in thin-film technology through subsequent trimming (i.e., subsequent correction of the layer thickness, and thus of the resonant frequency) until a desired layer thickness having a desired degree of homogeneity is obtained. These methods include additional deposition of material or subsequent removal of material. However, these methods are not yet mature enough for profitable mass production, and are also expensive.

Today, primarily two paths are known for tuning an FBAR resonator to a desired resonant frequency. If it is economically feasible for small-scale individual applications, the resonators can, as explained above, be trimmed to a desired resonant frequency individually, through subsequent layer deposition or subsequent ion-beam etching. Alternatively, through an external network matching, the resonators can be provided with external electrical switching elements, in particular with L and C elements, in order to set the desired resonant frequency $f_r$. However, this results in a high piece price for the filter, and moreover can be carried out only if the filter volume does not represent a critical size for use in telecommunication, as a sensor element, and in control circuits.

SUMMARY OF THE INVENTION

The object of the present invention is therefore to provide a resonator that can be tuned to a desired resonant frequency in a simple manner.

This object is achieved by a frequency-tunable resonator, comprising a basic element that comprises a piezoelectric layer having two main surfaces parallel to one another that are covered with a respective electrode layer; a first semiconducting layer formed in a vicinity of one of the main surfaces having an electrical conductivity of a first conductivity type, this conductivity being greater than that of the piezoelectric layer; the resonator further comprising a mechanism configured for applying a variable external prevoltage to the first semiconducting layer in order to influence a thickness of a space charge region that is formed in the first semiconducting layer; and at least two electric terminals, with at least one being connected with each respective electrode layer for applying at least one of an electrical voltage and a radio frequency signal.

The invention provides, in addition to the basic element of the resonator, besides the piezoelectric layer that can be excited to oscillation, a semiconducting layer that has an electrical conductivity of a first conductivity type, this conductivity being higher than that of the piezoelectric layer. On each of the two main surfaces of the basic element, a respective electrode layer is provided that comprises terminals for the application of an electrical voltage. Through the application of an electrical voltage to such a resonator, in such a basic element, the thickness of the Schottky space charge region is controlled through the diffusion of charge carriers, whereby the conductivity and thus the dialectical constant are significantly modified. Such a space charge region behaves differently than does the semiconducting layer in relation to a longitudinal acoustic wave, and supplies a thickness contribution to the active layer thickness, which determines the resonant frequency, of the basic element. Consequently, through the application of a voltage in the resonator according to the present invention the active layer thickness is increased, which results in a change of the resonant frequency. Thus, the resonator according to the present invention can be modified in its resonant frequency through the application of an external voltage to the electrodes.

Using a simple configuration, the present invention provides a resonator that can be set to a desired resonant frequency without expensive trimming methods and without expensive external switching elements. For small changes in voltage, there is an almost linear dependence of the resonant frequency change on the applied voltage. The polarity of the applied voltage determines the direction of the frequency shift, where in general an enlargement of the space charge region results in a higher resonant frequency, while a reduction in size of the space charge region results in a lower resonant frequency.

In embodiments of the invention, the semiconducting layer is preferably situated between the piezoelectric layer and an electrode. It has a first conductivity type and is set to be p- or n-conductive. According to the semiconductor used, the conductivity is set via a doping or via a modification of the normal stoichiometry of the semiconducting connection.

In embodiments of the invention, a material is used for the piezoelectric layer in which, through doping or modification of the stoichiometry, semiconducting properties and thus a higher conductivity can be set. As the electrical conductivity increases, the piezoelectric properties are lost. If such an originally piezoelectric material, correspondingly set to be semiconducting, is used for the semiconducting layer, then upon application of a voltage having suitable polarity the space charge region becomes larger in the semiconducting layer, whose properties then again approach those of the piezoelectric layer. The change of the resonant frequency is then dependent on the change in the thickness of the space charge region. The relation between the change of thickness of the space charge region and the layer thickness of the piezoelectric layer determines the amount by which the resonant frequency can be shifted.

The sameness of the material of the piezoelectric and semiconducting layer enables a particularly simple manufacture of the resonator according to embodiments of the invention. The semiconducting layer can be manufactured easily by modifying the deposition conditions or by doping the piezoelectric layer during the production of the layer with the thin-film method, or through subsequent doping of the piezoelectric layer in a layer region close to the surface of the basic element. The uniform, or nearly uniform, material of the basic element moreover results in a high degree of mechanical stability and stable oscillation properties, and avoids boundary surface problems between the semiconducting and the piezoelectric layer, as well as between the semiconducting layer and the electrodes.

In principle, apart from technical problems in the layer production, different materials can also be used for the piezoelectric layer and the semiconducting layer.

In an advantageous construction of an embodiment of the present invention, the basic element of the resonator has a structure resembling that of a pin diode. For this purpose, in addition to the first semiconducting layer of the first conductivity type, on the opposite surface of the piezoelectric layer, there is situated a second semiconducting layer having the opposite (second) conductivity type. Such a "pin structure" has the advantage that through the diffusion of charge carriers from a semiconducting layer of the first conductivity type into the semiconducting layer of the opposite conductivity type, a diffusion voltage automatically forms, and therewith a space charge region, i.e., a region depleted in majority charge carriers. The diffusion takes place as soon as the resulting diffusion voltage counteracts a further displacement of the majority charge carriers.

A natural space charge region thus arises whose thickness can be modified by the externally applied voltage. The external voltage that is to be applied can be poled in such a way that it enlarges the existing thickness of the space charge region in a manner that is additive to the diffusion voltage that arises. In the same way, a reduction in thickness of the processing region is possible through correspondingly oppositely poled external voltages. Here, the pin structure has the advantage that the combination of a first conductivity type with an opposed second conductivity type and a piezoelectric material connected therebetween having low conductivity produces significant diffusion voltages in the volt region. This ensures safety against breakdowns and frequency stability of the resonator in the case of radio-frequency adjacent alternating voltages. The level of the external voltage that can be applied in the blocking direction is unlimited. Of course, it is possible that the piezoelectric layer also has a low conductivity, where the majority charge carriers can be of the first or of the second conductivity type.

In a further advantageous embodiment of the present invention, a semiconducting layer is provided on both sides of the piezoelectric layer, both semiconducting layers being of the same conductivity type. The resonator according to the embodiment then has an nin or pip structure, borrowing the nomenclature used for the corresponding diodes. Such a resonator has, at the boundary surfaces between semiconducting layers and the piezoelectric layer (in the case of a pip structure), or at the boundary surfaces between semiconducting layers and electrodes (in the case of an nin structure), two space charge regions that arise, whose thickness can be increased or reduced by an applied external voltage. If the piezoelectric layer is likewise provided with an electrode by way of contacting, and the external voltage is applied as a blocking voltage acting symmetrically on both space charge regions, then in comparison to the pin structure this is advantageous because the overall thickness of the two space charge regions always remains constant, even in the case of a high-amplitude, radio-frequency alternating voltage applied during the operation of the resonator. In a pin structure, the thickness of the depletion region/layer can vary, given a radio-frequency alternating voltage having a large amplitude.

If the resonator is to be used in a mobile electrical device, operated for example using a battery, for example in a filter application for a wireless communication device, then, with pin, pip, and nin structures, a sufficient frequency shift of, for example, 4000 ppm is already achieved with standard battery voltages of up to three volts. The diffusion of charge carriers, i.e., electrons and holes, in the piezoelectric layer is possible, because these typically have a low residual conductivity due to accidental doping or contamination.

With the embodiments of the present invention, an economical resonator is obtained having a low space requirements, which can, for example, be operated using the power supply of commercially available mobile phones. The frequency tuning via the applied external voltage can be used in order to use resonators of the same type having the same resonant frequency, in order to set these to different resonant frequencies using different external voltages. However, with the aid of an external voltage, it is also possible to readjust resonators according to the present invention, having different resonant frequencies due to manufacturing tolerances, to the desired value or, if necessary, to a uniform value. This additionally simplifies manufacturing, because the allowed tolerance values for layer thickness fluctuations are significantly improved within different production batches. In relation to known frequency-tunable components, a component is obtained whose space requirement is significantly improved, and which moreover is realized as a single component. In this way, additional space is saved, which is additionally important for the miniaturization of portable devices, such as mobile phones.

Preferred materials for the piezoelectric layer that can be provided with semiconducting properties through corresponding variation of the stoichiometry or through doping are correspondingly zinc oxide, aluminum nitride, gallium nitride, indium nitride, silicon carbide, gallium arsenide, or cadmium sulfide. In principle, additional piezoelectric materials, not listed here, having semiconducting properties are also suitable. For these materials, the doping materials for the production of the corresponding conductivity types are also known. For example, for zinc oxide manganese, hydrogen, lithium, sodium or potassium are suitable for the production of a p-conductivity. An n-conductivity may be achieved here through aluminum, gallium, indium, or zinc sulfide. For aluminum nitride, magnesium, zinc, cadmium, or carbon are known as p-doping materials, while silicon can be used to produce an n-conductivity. For gallium nitride, the p-doping materials magnesium, zinc, cadmium, and carbon may be used, as well as the n-doping material silicon. For gallium arsenide, germanium, beryllium, and zinc are known for the production of a p-doping. Here an n-doping can be produced using tin, sulfur, and tellurium. In all these materials, a conductivity can also be set through modification of the stoichiometry, i.e., modification of the atom ratios of the binary materials. Such a setting can easily be achieved by modifying the deposition parameters in the corresponding thin-film methods, or by modifying the ratio of the initial materials.

As electrode materials, conventional electrode materials, such as molybdenum, titanium, tungsten, aluminum, gold, and platinum, are suitable. If necessary, a separate selection can be used for the first-manufactured, and therefore lower, electrode, because this electrode may serve as the basis for the thin-film deposition of semiconducting and piezoelectric layers. Here, first electrode layers made of molybdenum, tungsten, gold, or aluminum have proven successful.

In the selection of different materials for the piezoelectric and the semiconducting layers, attention is preferably paid to a compatibility of the layers, for example, to agreeing mechanical parameters, and in particular to similar coefficients of expansion and crystal parameters. Care is also to be taken that a different upper layer grows on the first lower layer well and homogeneously. If necessary, for the matching of the properties, it is possible to provide a neutral buffer layer between two layers, which is then provided with a sufficient electrical conductivity.

The charge carrier concentration in the semiconducting layer can be set to a range of $10^{14}$ to $10^{21}$ charge carriers per cm$^3$. If the semiconducting layer is originally a piezoelectric layer that becomes a semiconducting layer only through the doping, then in general it is true that the piezoelectric properties decrease as the conductivity increases. The lower region of the charge carrier density is here close to the intrinsic charge carrier density $n_i$, i.e., the charge carrier density that is also present in a "non-conducting" piezoelectric material. For example, the intrinsic charge carrier density $n_i$ of piezoelectric zinc oxide may be approximately $10^{12}$ per cm$^3$. Also, the higher the majority charge carrier density of the semiconducting layer, the greater the diffusion voltage that arises in the case of a component having a pin, pip, or nin structure. A higher diffusion voltage results in a thicker charge carrier region, and creates, in principle, the possibility of modifying the thickness of the depletion region through the application of a suitably poled voltage. Consequently, the control interval of the resonator according to embodiments of the present invention can be modified through variable doping concentrations and variable normal stoichiometry in the semiconducting layer.

Another parameter that determines the control interval of the resonator according to the present invention is the thickness of the semiconducting layers. Advantageously, this thickness is set between 10 and 500 nm. In general, the maximum relative frequency displacement $\Delta f_{max}/f_0$ also increases with the thickness of the semiconducting layer. However, the thickness of the piezoelectric layer is typically not freely selectable, because it is the frequency-determining component of a BAW resonator, and therefore has a fixed predetermined value dependent on the desired frequency.

DESCRIPTION OF THE DRAWINGS

In the following, the present invention is explained in more detail on the basis of exemplary embodiments and the associated nine Figures.

FIGS. 5 and 6 are schematic cross sections illustrating embodiments of the inventive resonators having pip and nin structures;

DETAILED DESCRIPTION OF THE PREFERRED EMBODIMENTS

As a first exemplary embodiment, a BAW resonator is manufactured on the basis of zinc oxide (ZnO) as a piezoelectric material. Except for the manufacture of the semiconducting layers, the construction of such a resonator takes place in accordance with methods that are known in principle, from, e.g., K. M. Lakin et al., Microwave Symposium Digest, IEEE MTT-S International 1995, pp. 838 to 886.

Figure 1:
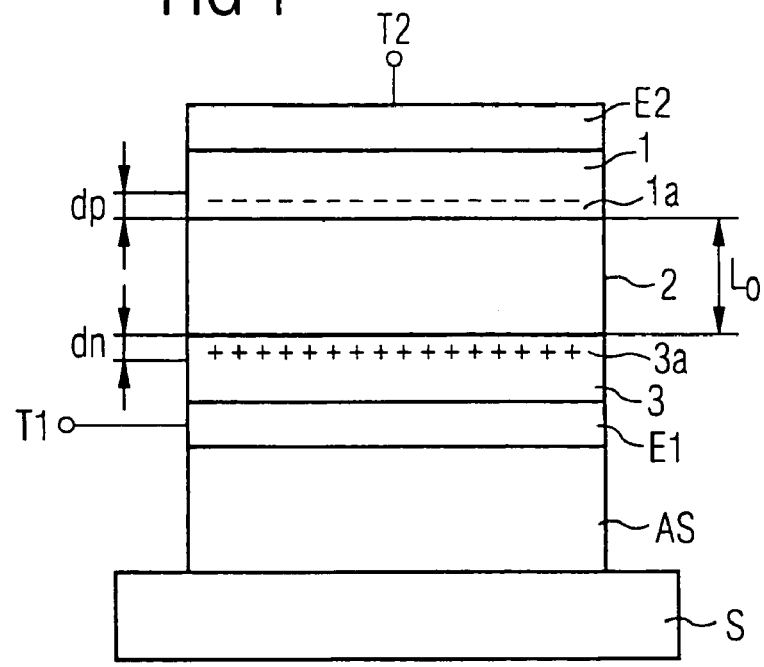
FIG. 1 is a schematic cross section of a resonator according to an embodiment of the present invention.

In FIG. 1, silicone, for example, can be used as a substrate. However, other substrate materials such as glass, SiC, SiGe, InP, GaAs, sapphire, or others are also possible. In order to avoid acoustic losses in the substrate material, the resonator can be constructed as a bridge structure, an air gap being situated between the lowest electrode E1 and the substrate material S. However, it is also possible, in particular as shown in FIG. 1, to provide an acoustic mirror AS between the substrate and the lowest electrode. This can easily be produced from quarter-wave layers, for example, of alternating layers of tungsten and silicon oxide, tungsten and silicon, aluminum nitride and silicon oxide, silicon and silicon oxide, molybdenum and silicon oxide, or other combinations of materials that have different acoustic impedances and that can be deposited one over the other in alternating fashion using thin-film technology.

Given the use of tungsten and silicon oxide, a combination having a high acoustic impedance difference, two pairs of quarter-wave layers are sufficient to reflect almost 100% of the acoustic wave. Given the use of tungsten and silicon and silicon oxide, a combination having a low acoustic impedance difference, at least 15 pairs of quarter-wave layers are required in order to reflect almost 100% of the acoustic wave.

Over the acoustic mirror AS, the first electrode E1 may then be produced, for example, through the sputtering of gold, aluminum, tungsten, or molybdenum. As alternative application methods, CVD methods or vapor-deposition methods are also suitable. For a resonator operating at, e.g., 2 GHz, 200 nm of aluminum, for example, may be sputtered on. Over first electrode E1, a first semiconductor layer 3 is produced, for example, an n-doped zinc oxide layer that is 50 nm thick. For this purpose, first undoped zinc oxide can be applied by sputtering or in a CVD method, and can subsequently be doped. For the n-doping, the elements aluminum, gallium, or indium are suitable. It is also possible to incorporate zinc sulfide as an n-conductive doping material, but this preferably takes place by way of co-deposition during the layer manufacture. A further alternative is to increase the oxygen content during the deposition of zinc oxide, whereby it is possible to produce a zinc oxide that is richer in oxygen and thus modified so as to be n-conductive. The doping takes place at a level of approximately $10^{14}$ to $10^{21}$ per cm$^3$, for example with a strength of $10^{17}$ cm$^{-3}$.

Over first semiconductor layer 3, the actual resonator layer, piezoelectric layer 2, may then be produced. Preferably, the undoped zinc oxide layer 2 is produced using the same method as was used for the first semiconducting layer, n-doped zinc oxide layer 3. According to the conditions of deposition, piezoelectric layer 2 can be deposited with a charge carrier concentration of $10^{11}$ to $10^{12}$ cm$^{-3}$, and thus with a lower intrinsic conductivity. With this charge carrier concentration, a zinc oxide having good insulating properties is obtained that still exhibits sufficient conductivity to enable the cited charge carrier diffusion in the zinc oxide layer. Zinc oxide layer 2 exhibits good piezoelectric properties.

As a second semiconducting layer, a thin layer of p-conductive zinc oxide is then produced thereover, for example, through the direct deposition of doped material or through the production of an oxygen-depleted zinc oxide that exhibits p-conductive properties due to the oxygen depletion. However, it is also possible to produce piezoelectric layer 2 with a correspondingly greater thickness, and to convert an upper layer region into a semiconducting layer 1 through subsequent doping. Here it is necessary that the depth of the doping be sufficiently monitored in order to ensure a clearly defined layer thickness of the piezoelectric layer, which, as already mentioned, represents the frequency-determining parameter of the resonator. For this reason, manufacturing methods are preferred in which the second semiconducting layer 1 is already produced in doped form. This makes it possible to produce sharper boundary surfaces.

Over the second semiconducting layer 1, upper electrode E2 may then be produced, which again can be constructed from a conventional electrode material, but preferably comprises the same material as first electrode E1, and is, for example, constructed from an aluminum layer having a thickness of 200 nm.

Electrical terminals T1 and T2 are provided for the application of a voltage and/or of an RF signal, these terminals being connected with first and second electrode E1, E2.

Figure 2:
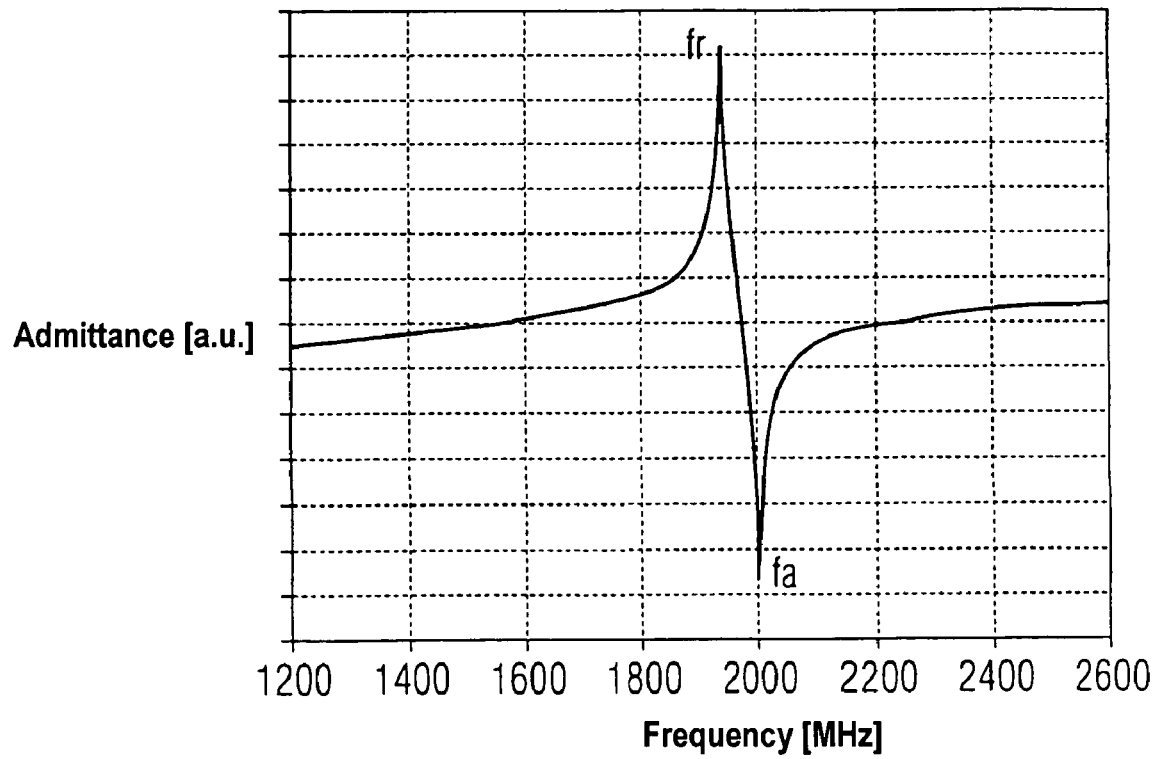
FIG. 2 is a graph showing the typical admittance curve of a resonator.

FIG. 2 shows the typical admittance curve of a resonator as observed both for known resonators and for resonators according to the present invention.

In the basic element comprising layers 1, 2, and 3, there then takes place, without external drive forces, a diffusion of charge carriers from one semiconductor layer to the other takes place, in particular of electrons from first semiconductor layer 3 into second semiconductor layer 1 and from holes in second semiconductor layer 1 into first semiconductor layer 3. The diffused charge carriers enrich themselves in more or less thick space charge regions 3a and 1a at both sides of piezoelectric layer 2, and compensate the primary charge carriers that are present there, which are of the respectively opposite type. In the space charge regions, there then exist practically no more free charge carriers. Here the thickness of space charge regions dp and dn is dependent on the level of doping, on the thickness of the semiconducting layers, and on the thickness of the piezoelectric layer. The overall thickness d of the space charge regions results as the sum of the individual space charge regions dp and dn: d=dp+dn.

Through the application of a voltage to terminals T1 and T2, diffusion voltage $V_D$ that has arisen due to the charge carrier diffusion can now be amplified or attenuated, where the thickness of the space charge regions is reduced or increased according to the polarity of the applied voltage. The overall thickness d of the depletion regions resulting from an applied external voltage U results from the equation:

$$d = \sqrt{L_0^2 + \frac{2\varepsilon_0 \varepsilon_r}{e_0}\left(\frac{1}{N_d} + \frac{1}{N_a}\right)(V_d + U)} - L_0$$

In this equation, $V_D$ is the diffusion voltage, $L_0$ is the original thickness of piezoelectric layer 2, and $N_d$ and $N_a$ are the doping densities of the donor in n-doped semiconductor layer 3 or in the acceptor of p-doped semiconductor layer 1. $e_0$ is the elementary charge of the electron, while $\epsilon_0$ and $\epsilon_r$ represent the dielectric and relative dielectric constants of the semiconducting layer.

Figure 3:
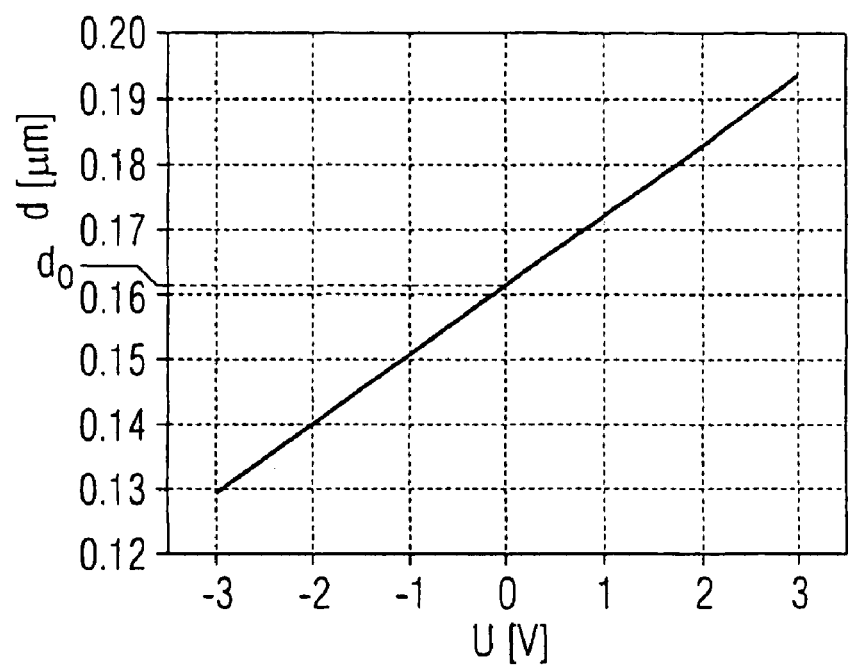
FIG. 3 is a graph providing an exemplary illustration of the dependence of the thickness of the space charge region on the applied external voltage for a pin structure.

FIG. 3 shows the characteristic of thickness d of the depletion region against the value of the applied external voltage U for the resonator in pin structure. For small changes, there is an approximately linear dependence of thickness d on voltage U.

Figure 4:
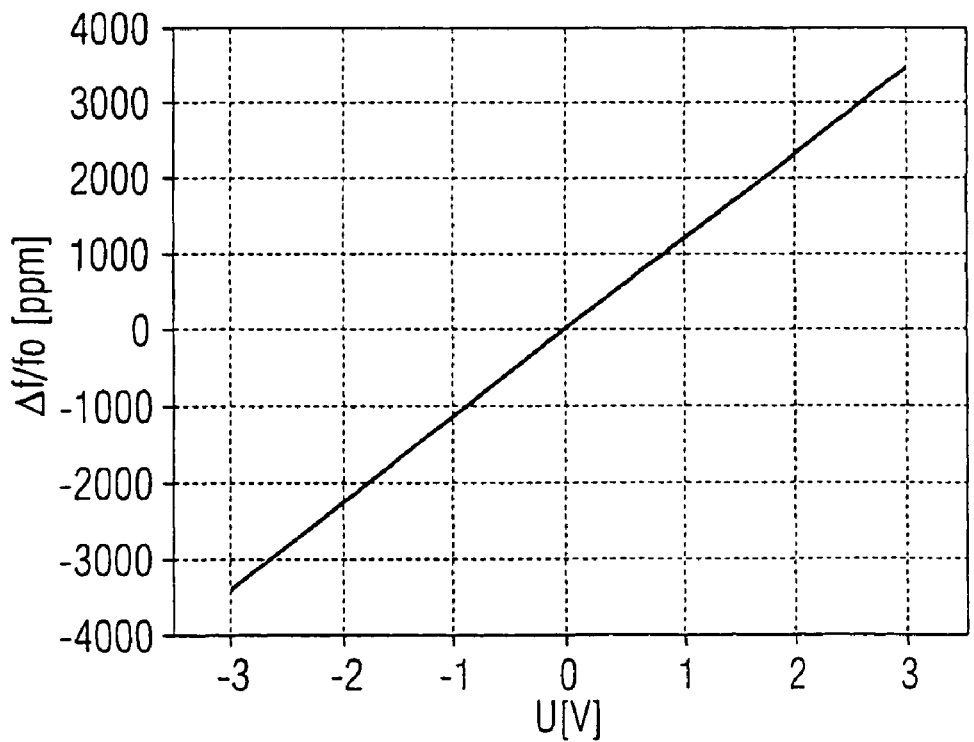
FIG. 4 is a graph providing an exemplary illustration of the relative resonant frequency change $\Delta f/f_0$ dependent on the applied external voltage for a pin structure.

FIG. 4 shows that the relative frequency change $\Delta f/f_0$, i.e., the ratio of the frequency change to the center frequency, is approximately linear. FIGS. 3 and 4 also show that the linearity also holds for an applied external voltage in the forward/conducting direction, as long as the voltage does not exceed the amount of the diffusion voltage of a resonator in pin structure. This ensures that the effective voltage, formed from the sum of the diffusion voltage and the applied external voltage, always points in the blocking direction.

A further examination checks to what extent the remaining properties of the resonator are adversely affected in the resonator according to the present invention. Via the specific resistances of the semiconducting layers and of the piezoelectric layer, together with the layer thicknesses thereof, the voltage drop over the individual layers can be shown. For a resonator according to an embodiment of the present invention, constructed as in FIG. 1, for example, the following material parameters are assumed. The electrodes comprising aluminum have a specific resistance of $2.7 \times 10^{-6}$ ohms×cm. The corresponding value for the p-doped and n-doped zinc oxide layers (first and second semiconducting layer) is 1 ohm×cm, with a doping of $4 \times 10^{23}$ m$^{-3}$ and a charge carrier mobility of 15 cm$^2$/Vs. The specific resistance of the piezoelectric zinc oxide is determined at $10^5$ Ohm cm. The diffusion voltages $V_D$ and the additionally applied voltage U therewith fall off essentially at depletion regions 1a and 3a, as well as at piezoelectric layer 2.

Because the full voltage is adjacent to the piezoelectrically effective layer region (piezoelectric layer+depletion region), the resonator function of this layer region is also not adversely affected.

A further examination estimates to what extent the semiconducting, and thus also electrically conductive, layers produce a noise component in the resonator. Such a noise contribution could arise if produced charges diffuse through the basic element to the respective counterelectrode, and there supply an additional current contribution, the noise contribution. However, a corresponding estimate shows that this additional noise contribution is negligibly small in relation to the unavoidable leakage current portion of optimal piezoelectric layers, if the resonator according to the present invention is operated in the blocking direction. From this it is clear that the resonator according to the present invention is suitable for radio-frequency filter applications, as is a conventional BAW resonator.

A further examination estimates to what extent the quasi-free charges inside the semiconducting layers can draw energy from a radio-frequency alternating field applied to electrodes E1 and E2. Such an energy drain would lead to a damping/attenuation of the acoustic longitudinal wave inside the resonator, thereby resulting in worse resonance properties. For viscous damping, a complex dependency is obtained, in which the relative dielectric constant of the material under consideration essentially represents the variable that can be varied. This in turn depends on the charge carrier density N. If the damping is determined dependent on the charge carrier density N, a pronounced maximum is obtained at a value of $N=0.004 \times 10^{17}$ cm$^{-3}$. At this maximum, the absorption is approximately 100 times higher than is that of undoped zinc oxide, i.e., of the piezoelectric material.

In comparison with the absorption of aluminum, the maximum is approximately 13 times higher, while in contrast it is only five times higher than the absorption of gold, which is a standard electrode material for resonators. With the doping selected for the semiconducting layers of $4 \times 10^{17}$ cm$^{-3}$, a charge carrier density is obtained that fluctuates by approximately two orders of magnitude with the applied voltage U. The absorption in the p-doped and n-doped zinc oxide layers (semiconductor layers 1 and 3) thus corresponds at the highest to the absorption of a gold layer having the same thickness, which is used as an electrode in standard BAW resonators. The additional absorption of resonators according to embodiments of the present invention is thus small in relation to that in conventional resonators.

FIG. 5 shows an exemplary embodiment of the present invention in which the resonator has a pip structure due to corresponding semiconducting layers. With the aid of an additional electrode E3 on piezoelectric layer 2, which represents the i-layer in the pip structure, the p-doped semiconducting layers 4 and 5 can be biased against piezoelectric layer 2, where a negative pre-poling of semiconducting layers 4 and 5 (as shown in the Figure by the indicated polarity) results in an increase in the blocking voltage. The thickness of the space charge regions, which form at the two boundary surfaces between semiconducting layers 4 and 5 and piezoelectric layer 2, varies with the level of the applied external voltage. The space charge regions are represented by the written-in signs of the charge areas of the space charge regions.

FIG. 6 shows a further exemplary embodiment of the present invention, in which the resonator has an nin structure due to corresponding n-doped semiconducting layers 6 to 7. Here it is emphasized that the space charge regions are formed between semiconducting layer 6 and metal electrode E1, as well as between semiconducting layer 7 and metal electrode E2 (metal semiconductor Schottky contact). With the aid of an additional electrode E3 on piezoelectric layer 2, which represents the i-layer in the pip structure, semiconducting layers 6 and 7 can be biased against metal electrodes E1 and E2; here as well, a negative pre-poling of metal electrodes E1 and E2 (as shown in the Figure by the indicated polarity) results in an increase in the blocking voltage. The thickness of the space charge regions varies with the level of the applied external voltage. Here as well, the space charge regions are represented by the indicated signs of the charged areas of the space charge regions.

Figure 7:
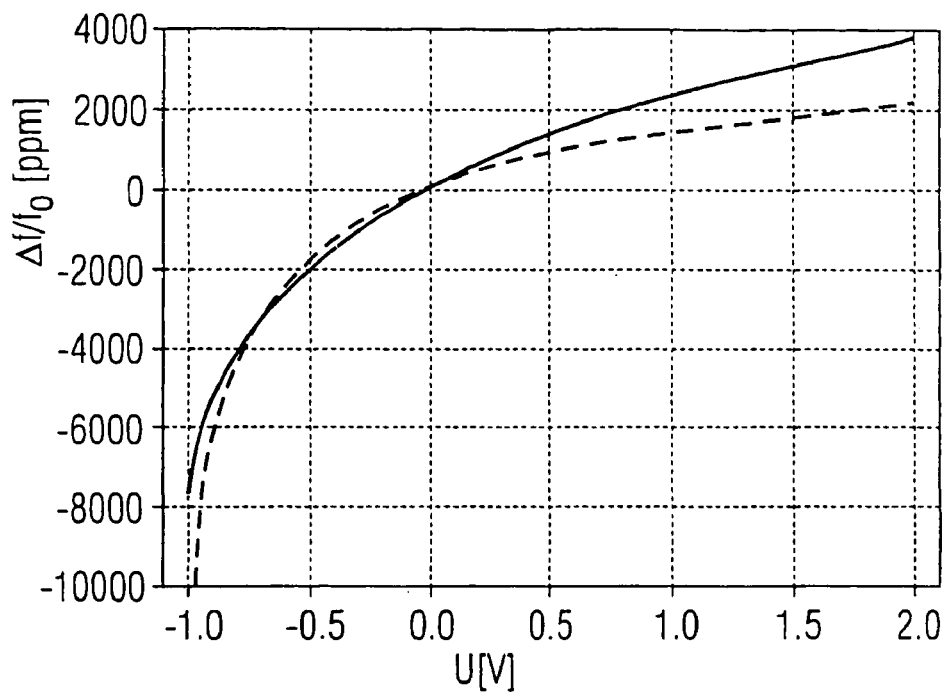
FIG. 7 is a graph providing an exemplary illustration of the relative resonant frequency change $\Delta f/f_0$ dependent on the applied external voltage.

FIG. 7 shows, as an example for resonators in nin structure, the calculated (here non-linear) dependence of the relative resonant frequency shift on the applied voltage U. Here, the solid line stands for a doping density of $10^{17}$ per cm$^3$, and the broken line stands for a doping density of $10^{15}$ per cm$^3$. From this, it can be seen that control intervals can be set via suitable doping densities within certain limits. In addition, the controlling of the resonant frequency can take place with different sensitivities, resulting from the ratio of the resonant frequency interval to the voltage interval, and corresponding to the slope/gradient of the curve. For resonators in pip structure, a characteristic that is similar in principle is calculated, where only the voltages required for a shift vary.

Figure 8:
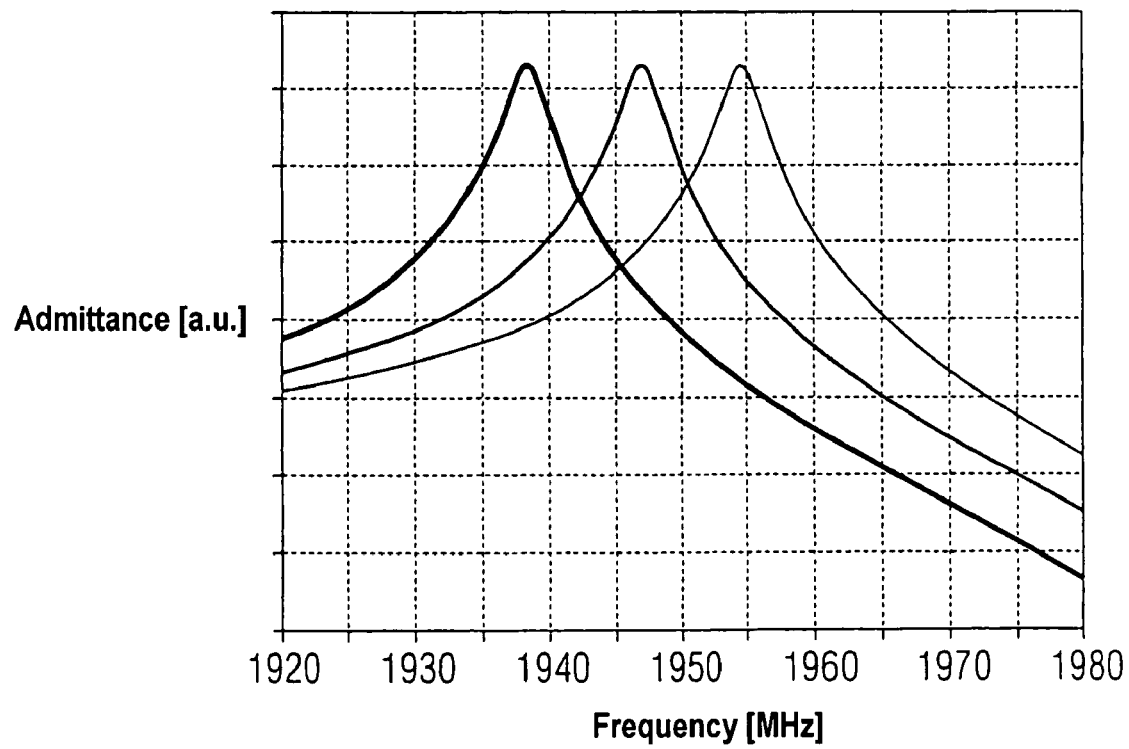
FIG. 8 is a graph showing examples of resonant frequency shifts on the basis of admittance curves.

FIG. 8 shows, as an example on the basis of a specific construction of a resonator in nin structure, the admittance curves of the resonator without and with different applied external voltages. The resonant frequency shifts achieved thereby amount to −4100 ppm from 1947 MHz to 1939 MHz, or +4100 ppm from 1947 MHz to 1955 MHz. The different directions of the shift thereby achieved through different polarity is of the applied external voltage. A similar picture is observed for resonators in pip structure, in which the respectively required voltages are selected differently.

Figure 9:
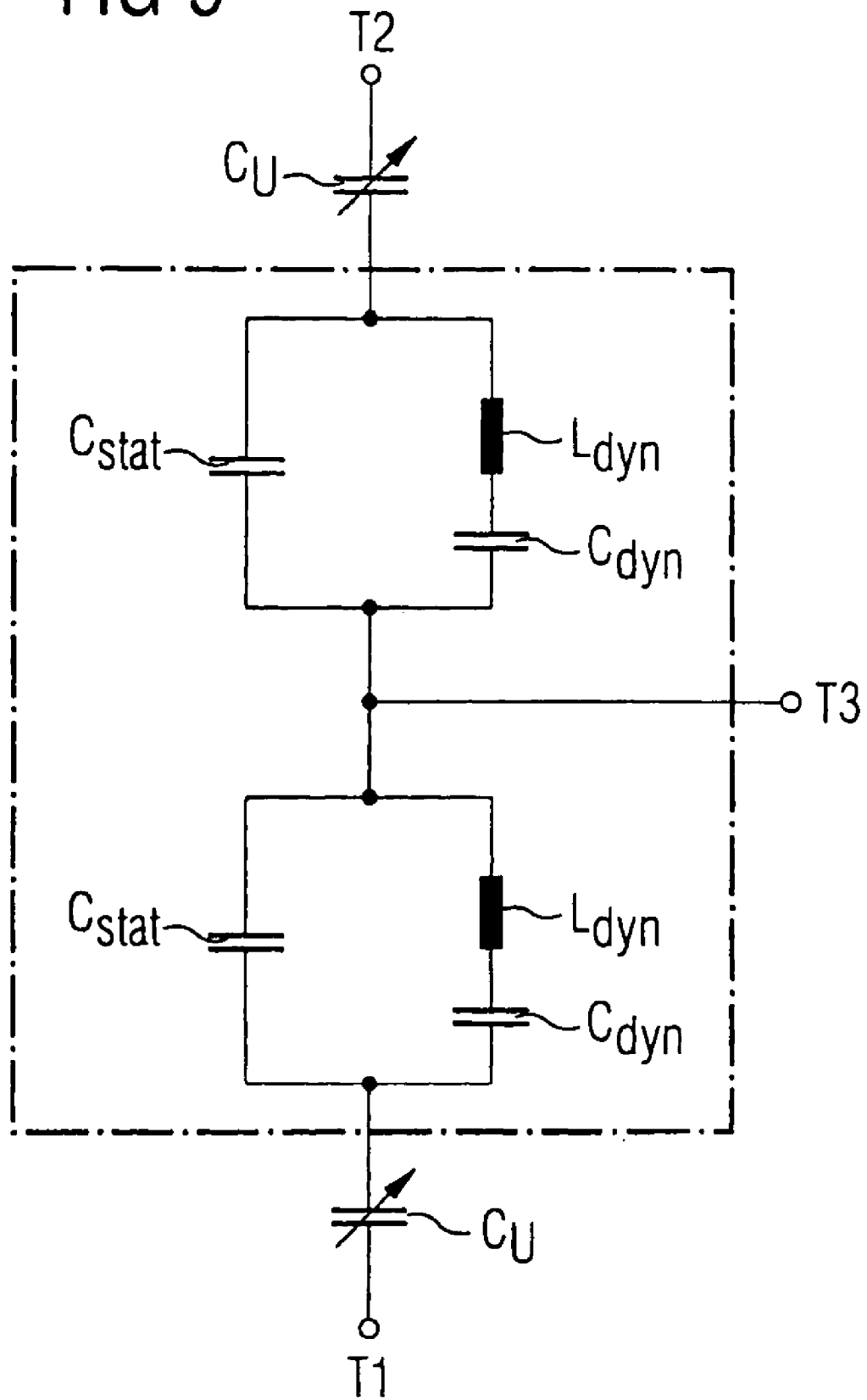
FIG. 9 is an exemplary schematic circuit diagram illustration of the electronic equivalent of resonators according to embodiments of the present invention having pin, pip, and nin structures.

In FIG. 9, the electronic equivalent circuit diagram of the resonator whose frequency can be tuned by way of semiconducting layers is shown in pin, pip, and nin structure. Here, the resonator is given in its non-frequency-tunable form, without a semiconducting layer, by the elements $L_{dyn}$ and $C_{dyn}$, as well as $C_{stat}$ (elements enclosed in a broken line). $L_{dyn}$ and $C_{dyn}$ designate the dynamic inductance and the dynamic capacitance of the BAW resonator, and $C_{stat}$ designates the static capacitance of the resonator. Voltage-controlled space charge regions, which enable the frequency tunability through the introduction of semiconducting layers into the BAW resonator, are taken into account in the equivalent circuit diagram by the voltage-dependent additional capacitance $C_U$. T1 and T2 indicate the electrical terminals for the application of a voltage and/or of an RF signal, and T3 is the electrode on the piezoelectric layer for resonators in nin and pip structure. The level of voltage U applied externally reduces or increases the thickness of space charge region d, where the voltage-dependent capacitance $C_U$ increases or decreases inversely thereto. In the equivalent circuit diagram, the simple relation between the relative resonant frequency shift $\Delta f/f_0$ and the voltage-dependent capacitance $C_U$ is given by the equation $$\frac{\Delta f}{f_0} = \sqrt{1 + \left(\frac{fa^2}{fr^2} - 1\right)\left(\frac{1}{1 + \frac{C_U}{C_{stat}}}\right)} - 1$$

Here, fr and fa designate the resonant frequency and the antiresonant frequency of the frequency-tunable resonator.

Although in the exemplary embodiments the present invention was described only on the basis of a concrete structure, it is not limited to this structure. Rather, all combinations of piezoelectric layers and semiconducting layers result in resonators according to the present invention, because given such combinations, a depletion region forms in the semiconducting layer, either by itself or at the latest through the applied external voltage, the size of this depletion region being voltage-controlled, so that the depletion region thereby influences the resonant frequency of the resonator. Thus, the selection of the material that is suitable for the piezoelectric layer is also practically unlimited, as is the selection of the material for the semiconducting layer. However, combinations of the piezoelectric layer and semiconducting layer on the same material basis are preferred, whereby the semiconducting properties are set through corresponding doping or modification of the stoichiometry. Further parameters include the layer thickness ratios of the relevant layers, as well as the level of the dopings, or the level of the charge carrier concentration in the semiconducting layers.

Resonators according to the present invention can be used as adjustable frequency emitters. Preferably, they can be used as reactance elements in pass-band filters in branching technology, e.g., having a ladder-type structure. An application of the resonators is also possible in sensors in which an external physical quantity acts on the resonant frequency and the frequency shift represents a criterion for the quantity. Through the inventive readjustment of the resonant frequency, a simple determination of the quantity to be measured can take place via the readjustment voltage.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art. The particular implementations shown and described herein are illustrative examples of the invention and are not intended to otherwise limit the scope of the invention in any way. For the sake of brevity, conventional aspects of the device may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

The invention claimed is:

1. A frequency-tunable resonator, comprising:
a basic element that comprises:
a piezoelectric layer having two main surfaces parallel to one another that are covered with a respective electrode layer;
a first semiconducting layer formed in a vicinity of one of the main surfaces having an electrical conductivity of a first conductivity type, this conductivity being greater than that of the piezoelectric layer;
the resonator further comprising:
a mechanism configured for applying a variable external pre-voltage to the first semiconducting layer in order to control a thickness of a space charge region that is formed in the first semiconducting layer; and
at least two electric terminals, with at least one being connected with each respective electrode layer for applying at least one of an electrical voltage and a radio frequency signal.

2. The resonator as claimed in claim 1, wherein the semiconducting layer and the piezoelectric layer either: a) comprise the same material, with the exception that the semiconducting layer, in contrast to the piezoelectric layer, has a doping, or b) are related in that the semiconductor layer comprises a material having a modified stoichiometry with respect to the Piezoelectric layer material.

3. The resonator as claimed in claim 1, further comprising:
a second semiconducting layer formed in a vicinity of the main surface situated opposite the first semiconducting layer having an electrical conductivity that is higher than that of the piezoelectric layer and is of the opposite conductivity type;
the basic element with the semiconducting layers and the piezoelectric layer situated therebetween comprising a structure of a pin diode.

4. The resonator as claimed in claim 1, further comprising:
a second semiconducting layer formed in a vicinity of the main surface situated opposite the first semiconducting layer having an electrical conductivity that is higher than that of the piezoelectric layer and is of the same conductivity type; and
an additional electrode connected to the piezoelectric layer.

5. The resonator as claimed in claim 1, wherein material of the piezoelectric layer has semiconducting properties, and is selected from the group consisting of zinc oxide, aluminum nitride, gallium nitride, indium nitride, silicon carbide, gallium arsenide, and cadmium sulfide, or the piezoelectric layer comprises another piezoelectric material having semiconducting properties.

6. The resonator as claimed in claim 1, wherein the semiconducting layer has a doping or a charge carrier density in the range of $10^{14}$ to $10^{21}$ cm$^{-3}$.

7. The resonator as claimed in claim 1, further comprising:
a second semiconducting layer formed in a vicinity of the main surface situated opposite the first semiconducting layer, the basic element being limited by the semiconducting layers, and the first semiconducting layer and the second semiconducting layer each have a thickness of 10 to 500 nm.

8. The resonator as claimed in claim 1, wherein the piezoelectric layer has a thickness dimensioned such that the resonant frequency $f_0$ of the resonator is in a range of the frequencies that are standard for wireless communications systems.

9. The resonator as claimed in claim 8, wherein the resonance frequency is between 500 MHz to 10 GHz.

10. A resonator system, comprising:
the resonator as claimed in claim 1; and
a voltage source having a variable setting that is connected to the electric terminals of the resonator.

11. A method for utilizing a resonator, comprising:
providing the resonator according to claim 1 as a reactance element in a pass-band filter constructed in branching technology; and
operating the resonator as the reactance element of the band-pass filter.

12. A method for utilizing a resonator, comprising:
providing the resonator according to claim 1 as a frequency transducer; and
adjusting the frequency transducer with respect to its resonant frequency.

13. A method for utilizing a resonator, comprising:
providing the resonator according to claim 1 as a sensor; and
utilizing the sensor for a physical quantity that influences an oscillation of the resonator.

14. The method according to claim 13, further comprising:
modifying, by the physical quantity, a resonant frequency of the resonator; and readjusting the resonant frequency of the resonator to an original resonant frequency through application of a control voltage, a level of the control voltage being taken as a criterion for a value of the physical.

15. A method for electrically tuning a resonance frequency of a bulk acoustic wave (BAW) resonator, comprising:
    providing a basic element having two electrodes situated on two main surfaces parallel to one another, the basic element comprising a piezoelectric layer and two semiconducting layers, and comprising a structure similar to a pin diode, having a space charge region;
    connecting the electrodes to a voltage source; and
    applying a voltage with the voltage source to the electrodes so that a thickness (d) of the space charge region changes by an amount $\Delta d$, a resonant frequency of the BAW resonator changing by an amount $\Delta f$.

16. The method as claimed in claim 15, further comprising:
    setting a voltage level via a variable voltage source in such a way that a voltage resulting from a sum of applied external voltage plus diffusion voltage that arises still represents a blocking voltage.

17. The method as claimed in claim 15, further comprising:
    determining the resonant frequency fr of the BAW resonator without an applied voltage;
    subsequently applying and setting the voltage such that the resonant frequency fr changes by an amount $\Delta f$ such that the change of the resonant frequency $\Delta f$ relative to the starting frequency f ranges from −4100 ppm to +4100 ppm: −4100 ppm≦$\Delta f/f$≦+4100.

18. The method as claimed in claim 15, further comprising:
    providing, in a component, a multiplicity of resonators that operate at different nominal frequencies; and
    setting resonators of a same type that may have different resonant frequencies to a respectively desired value for the resonant frequency through applying a suitable control voltage.

19. A method for electrically tuning a resonance frequency of a bulk acoustic wave (BAW) resonator, comprising:
    providing a basic element having two electrodes situated on two main surfaces parallel to one another, the basic element comprising a piezoelectric layer and two semiconducting layers, and comprising a structure similar to a pip or nin diode having space charge regions;
    providing an additional electrode on the piezoelectric layer;
    connecting the electrodes to a voltage source; and
    applying a voltage with the voltage source to the electrodes so that in a pip structure, the semiconducting layers are biased against the piezoelectric layer, or in an nin structure, the semiconducting layers are biased against the electrodes, so that the thickness (d) of the space charge region changes by an amount $\Delta d$, a resonant frequency of the BAW resonator changes by an amount $\Delta f$.

20. The method as claimed in claim 19, further comprising:
    setting a voltage level via a variable voltage source in such a way that a voltage resulting from a sum of applied external voltage plus diffusion voltage that arises still represents a blocking voltage.

21. The method as claimed in claim 19, further comprising:
    determining the resonant frequency fr of the BAW resonator without an applied voltage;
    subsequently applying and setting the voltage such that the resonant frequency fr changes by an amount $\Delta f$ such that the chance of the resonant frequency $\Delta f$ relative to the starting frequency f ranges from −4100 ppm to +4100 ppm: −4100 ppm≦$\Delta f/f$≦+4100.

22. The method as claimed in claim 19, further comprising:
    providing, in a component, a multiplicity of resonators that operate at different nominal frequencies; and
    setting resonators of a same type that may have different resonant frequencies to a respectively desired value for the resonant frequency through applying a suitable control voltage.

* * * * *